(12) United States Patent
Lee

(10) Patent No.: US 10,854,851 B2
(45) Date of Patent: Dec. 1, 2020

(54) DISPLAY DEVICE

(71) Applicant: Samsung Display Co., Ltd., Yongin-Si (KR)

(72) Inventor: Jong-Nam Lee, Hwaseong-si (KR)

(73) Assignee: Samsung Display Co., Ltd.

( * ) Notice: Subject to any disclaimer, the term of this patent is extended or adjusted under 35 U.S.C. 154(b) by 42 days.

(21) Appl. No.: 16/119,895

(22) Filed: Aug. 31, 2018

(65) Prior Publication Data

US 2019/0207167 A1 Jul. 4, 2019

(30) Foreign Application Priority Data

Jan. 2, 2018 (KR) ........................ 10-2018-0000159

(51) Int. Cl.
*G02F 1/1335* (2006.01)
*H01L 51/52* (2006.01)
*H01L 27/32* (2006.01)

(52) U.S. Cl.
CPC ...... *H01L 51/5281* (2013.01); *H01L 27/3276* (2013.01); *H01L 51/5237* (2013.01); *H01L 27/3244* (2013.01)

(58) Field of Classification Search
CPC ....... H01L 27/32–3297; H01L 27/3276; H01L 27/3244; H01L 51/0097; H01L 51/52–5296; H01L 51/5281; H01L 51/5246; H01L 51/525; H01L 51/5253; H01L 51/5293; H01L 51/5237–5259; H01L 2251/5338; G02B 5/30–3091; G02F 1/133528; G02F 1/133533; G02F 1/133536; G02F 2001/133531; G02F 2001/133538–13355

See application file for complete search history.

(56) References Cited

U.S. PATENT DOCUMENTS

| | | | | |
|---|---|---|---|---|
| 2009/0115942 A1* | 5/2009 | Watanabe | ......... | G02F 1/133305 349/96 |
| 2011/0199348 A1* | 8/2011 | Takatani | ............ | G02F 1/13452 345/204 |
| 2012/0019746 A1* | 1/2012 | Yamada | ............... | G02B 5/3033 349/96 |
| 2013/0169515 A1* | 7/2013 | Prushinskiy | ............ | H01L 51/56 345/55 |
| 2014/0240641 A1* | 8/2014 | Kang | ................ | G02F 1/133308 349/62 |
| 2015/0144921 A1* | 5/2015 | Lim | .................... | H01L 51/0097 257/40 |

(Continued)

FOREIGN PATENT DOCUMENTS

KR 10-2013-0036936 A 4/2013
KR 10-2013-0141921 A 12/2013

(Continued)

*Primary Examiner* — Eric A. Ward
(74) *Attorney, Agent, or Firm* — Innovation Counsel LLP

(57) ABSTRACT

A display device according to an exemplary embodiment includes a display panel including a display area and a non-display area and a polarizing layer disposed on the display panel, and including a main portion for at least covering the display area and an extension for covering part of the non-display area. The polarizing layer includes a groove for extending along a border of the main portion and the extension.

19 Claims, 11 Drawing Sheets

(56) References Cited

U.S. PATENT DOCUMENTS

| | | | |
|---|---|---|---|
| 2015/0185527 A1* | 7/2015 | Chang | H01L 51/5246 349/12 |
| 2015/0188081 A1* | 7/2015 | Kim | H01L 51/5246 257/40 |
| 2016/0306488 A1* | 10/2016 | Kim | G06F 1/1637 |
| 2017/0045672 A1* | 2/2017 | Lee | H01L 27/1218 |
| 2017/0343848 A1* | 11/2017 | Abe | G02F 1/1339 |
| 2018/0182820 A1* | 6/2018 | Kim | G06F 3/044 |
| 2019/0097178 A1* | 3/2019 | Cho | H01L 51/5281 |

FOREIGN PATENT DOCUMENTS

| | | |
|---|---|---|
| KR | 10-2014-0056548 A | 5/2014 |
| KR | 10-2015-0057290 A | 5/2015 |
| KR | 10-2015-0081868 A | 7/2015 |
| KR | 10-2017-0080242 A | 7/2017 |

* cited by examiner

DISPLAY DEVICE

CROSS-REFERENCE TO RELATED APPLICATION

This application claims priority to and the benefit of Korean Patent Application No. 10-2018-0000159 filed in the Korean Intellectual Property Office on Jan. 2, 2018, the entire contents of which are incorporated herein by reference.

BACKGROUND

(a) Technical Field

This disclosure relates to a display device.

(b) Description of the Related Art

Display devices such as an organic light emitting device or a liquid crystal display may include a display panel having a screen for displaying images and a polarizing layer disposed on the display panel. The display device may include a window for covering the display panel so as to protect the display panel. The window may be attached to the polarizing layer by an adhesive agent such as an optically clear resin (OCR).

A flexible printed circuit film may be bonded to the display panel. The polarizing layer may not be disposed in the region where the flexible printed circuit film is bonded on the display panel. Accordingly, a gap may exist between the display panel and the window in the region where the polarizing layer is not positioned. The gap may increase deformation of the display panel when an electronic device including a display device falls, and a damage rate of the display device may increase.

The above information disclosed in this Background section is only for enhancement of understanding of the background and therefore it may contain information that does not form the prior art that is already known in this country to a person of ordinary skill in the art.

SUMMARY

Embodiments provide a display device with improved reliability.

An exemplary embodiment provides a display device including a display panel including a display area and a non-display area and a polarizing layer disposed on the display panel, and including a main portion covering the display area and an extension covering part of the non-display area. The polarizing layer includes a groove extending along a border of the main portion and the extension.

The display device may further include an adhesive layer disposed on the polarizing layer and a window disposed on the adhesive layer. The adhesive layer may overlap the main portion of the polarizing layer and may not overlap the extension of the polarizing layer.

The display panel may include a first substrate and a second substrate disposed on the first substrate, and the polarizing layer may be disposed on the second substrate. The first substrate may include an edge area not overlapping the second substrate, and the extension of the polarizing layer may be positioned near the edge area of the first substrate.

The display device may further include a first flexible printed circuit film bonded to the first substrate and a second flexible printed circuit film bonded to the second substrate. The extension of the polarizing layer may be disposed at respective sides of the second flexible printed circuit film.

The polarizing layer may include a cutout, and the extension of the polarizing layer may be disposed at respective sides of the cutout.

The polarizing layer may include a phase retarder layer, a polarizer layer disposed on the phase retarder layer, and a first support layer disposed on the polarizer layer. The groove may pass through the first support layer and may at least reach the polarizer layer.

The polarizing layer may further include a passivation layer disposed on the first support layer, and the groove may be formed at least to the polarizer layer from the passivation layer.

The polarizing layer may further include a second support layer disposed between the phase retarder layer and the polarizer layer, and the groove may be formed at least to the second support layer.

The groove may have a V shape, a U shape, or a quadrangular cross-sectional shape.

The display device may further include a spacer disposed between the extension of the polarizing layer and the window.

Another embodiment provides a display device including a display panel including a first substrate and a second substrate disposed on the first substrate and a polarizing layer disposed on the second substrate. The second substrate may include a pad portion bonded to a flexible printed circuit film, and the polarizing layer may include a cutout overlapping the pad portion.

The display panel may include a display area and a non-display area, and the polarizing layer may include a main portion for at least covering the display area and an extension for covering the non-display area. The cutout may be defined by edges facing the extension and an edge of the main portion adjacent to the edges.

An edge of the extension may correspond to an edge of the second substrate adjacent to the pad portion.

The polarizing layer may include a groove extending along a border of the main portion and the extension.

The display device may further include an adhesive layer disposed on the polarizing layer and a window disposed on the adhesive layer. The adhesive layer may overlap the main portion of the polarizing layer and may not overlap the extension of the polarizing layer.

The extension of the polarizing layer may be disposed at respective sides of the pad portion.

The polarizing layer may include a phase retarder layer, a polarizer layer disposed on the phase retarder layer, and a first support layer disposed on the polarizer layer, and the groove may pass through the first support layer and may at least reach the polarizer layer.

The polarizing layer may further include a passivation layer disposed on the first support layer, and the groove may be formed at least to the polarizer layer from the passivation layer.

The polarizing layer may further include a second support layer disposed between the phase retarder layer and the polarizer layer, and the groove may be formed at least to the second support layer.

The display device may further include a spacer disposed between the extension of the polarizing layer and the window.

According to the exemplary embodiments, the reliability of the display device may be improved by reducing the gap between the display panel and the window. Further, the attaching characteristic of the window of the display device may be improved.

DETAILED DESCRIPTION OF THE EMBODIMENTS

Figure 1:
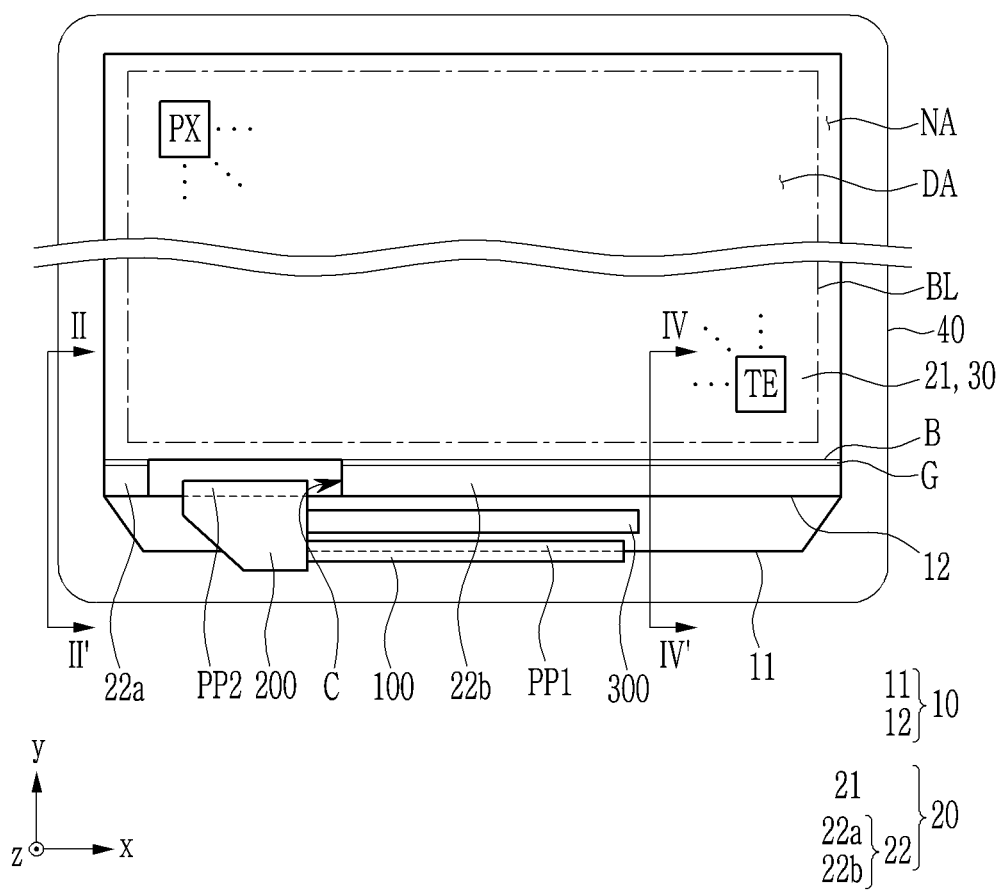
FIG. 1 shows a top plan view of a display device according to an exemplary embodiment.

The present inventive concept will be described more fully hereinafter with reference to the accompanying drawings, in which exemplary embodiments of the present inventive concept are shown. As those skilled in the art would realize, the described embodiments may be modified in various different ways, all without departing from the spirit or scope of the present inventive concept.

The drawings and description are to be regarded as illustrative in nature and not restrictive, and like reference numerals designate like elements throughout the specification.

The size and thickness of each configuration shown in the drawings are arbitrarily shown for better understanding and ease of description, and the present inventive concept is not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

A display device according to an exemplary embodiment of the present inventive concept will now be described with reference to accompanying drawings. An organic light emitting device will be exemplified as the display device, but the present inventive concept is not limited to the organic light emitting device, and it is applicable to other types of display devices such as a liquid crystal display.

Figure 2:
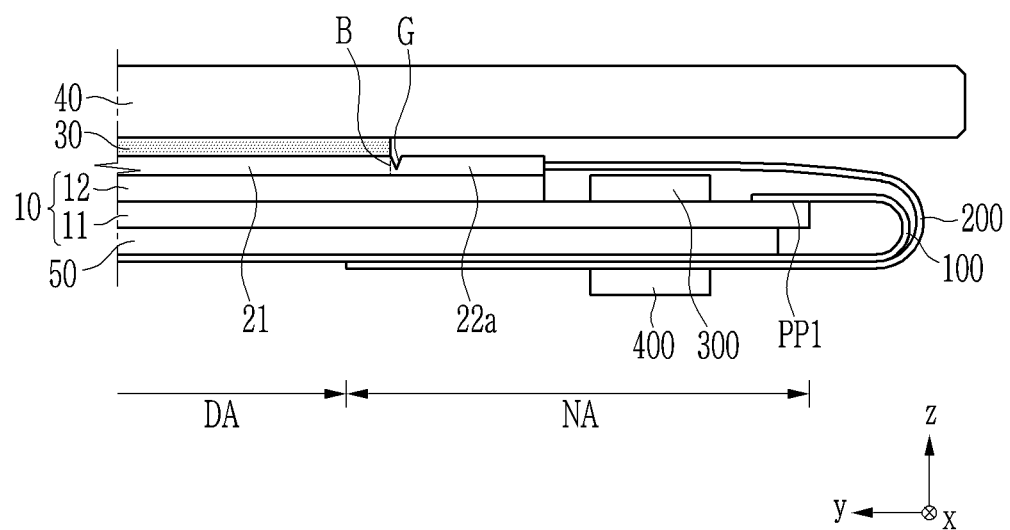
FIG. 2 shows a lateral view with respect to a line II-II' of FIG. 1.

FIG. 1 shows a top plan view of a display device according to an exemplary embodiment and FIG. 2 shows a lateral view with respect to a line II-II' of FIG. 1.

Referring to FIG. 1 and FIG. 2, the display device according to an exemplary embodiment includes a display panel 10, a polarizing layer 20 disposed on the display panel 10, an adhesive layer 30 disposed on the polarizing layer 20, a window 40 disposed on the adhesive layer 30, and a first flexible printed circuit film 100 and a second flexible printed circuit film 200 bonded to the display panel 10.

The display panel 10 displays an image and senses a touch. The display panel 10 includes a display area (DA) provided inside with reference to a border line (BL) shown with single-dot chain lines and corresponding to a screen for displaying an image, and a non-display area (NA) in which elements and/or wires for generating and/or transmitting various signals applied to the display area (DA) are formed. A touch area (TA) for sensing a touch may substantially correspond to the display area (DA). Pixels (PXs) and touch electrodes (TEs) are arranged, for example, in a matrix in the display area (DA) and the touch area TA. The pixels (PXs) may display images, and the touch electrodes (TE) may sense a contacting or non-contacting touch. The display panel 10 may be referred to as a touch screen panel.

The display panel 10 includes a first substrate 11 and a second substrate 12. The first substrate 11 is bonded to the second substrate 12 by a sealant. A display active layer including pixels (PXs) and wires connected thereto is disposed between the first substrate 11 and the second substrate 12. A touch sensing layer including touch electrodes (TEs) and wires connected thereto is disposed on the second substrate 12. The touch sensing layer may be disposed between the first substrate 11 and the second substrate 12.

A first pad portion PP1 for receiving signals for operating and controlling the pixels (PXs) is disposed on the first substrate 11 of the display panel 10. The first flexible printed circuit film 100 is bonded to the first pad portion PP1. A second pad portion PP2 for receiving signals for operating and controlling the touch electrodes (TEs) is disposed on the second substrate 12 of the display panel 10. A second flexible printed circuit film 200 is bonded to the second pad portion PP2.

A display driver 300 for generating signals for driving pixels (PXs) is disposed on the first substrate 11. The display driver 300 may be provided as an integrated circuit chip, and may include a data driver and a signal controller. The display driver 300 may be disposed on the first flexible printed circuit film 100. A touch driver 400 for generating signals for driving the touch electrodes (TEs) and processing the signals provided by the touch electrodes (TEs) is disposed on the second flexible printed circuit film 200. The touch driver 400 may be provided as an integrated circuit chip.

Three edges (an upper edge, a left edge, and a right edge on the x-y plain) of the first substrate 11 may substantially correspond to three edges of the second substrate 12, and for the purpose of bonding of the first flexible printed circuit film 100, the first substrate 11 is formed to be longer than the second substrate 12 in the region (i.e., the lower edge area) in which the first pad portion PP1 is disposed.

The polarizing layer 20 is disposed on the second substrate 12 of the display panel 10. The polarizing layer 20 of the organic light emitting device functions to reduce the reflection of external light. Three edges (an upper edge, a left edge, and a right edge on the x-y plain) of the polarizing layer 20 may substantially correspond to three edges of the second substrate 12 in a plan view. However, regarding the polarizing layer 20, a cutout (C) is formed in the region (i.e., the lower edge area) in which the second pad portion PP2 is disposed, for the purpose of bonding of the second flexible printed circuit film 200. The cutout (C) represents a portion generated by removing the polarizing layer 20 as if cutting the same, and the polarizing layer 20 does not overlap the second pad portion PP2 at the cutout (C). The cutout (C) is formed to be wider than the second pad portion PP2 so as to not interrupt a pressing tool when the second flexible printed circuit film 200 is bonded. The cutout (C) may have a substantially rectangular plain shape, but is not limited thereto. The lower edge of the polarizing layer 20 except for the cutout (C) may substantially correspond to the lower edge of the second substrate 12 in a plan view.

The polarizing layer 20 includes a main portion 21 on an upper side and extensions 22 on respective sides on a plain with respect to the cutout (C). The main portion 21 covers the entire display area (DA) and part of the non-display area (NA). The extension 22 at least covers part of the non-display area (NA) provided on the lower side of the display area (DA). The extension 22 includes a first portion 22a disposed on the left of the cutout (C) and a second portion 22b disposed on the right thereof. Therefore, the cutout (C) may be formed by facing edges of the first portion 22a and the second portion 22b, and an edge of the main portion 21 provided near them.

When the polarizing layer 20 is formed to extend to the lower edge of the second substrate 12, a gap between the second substrate 12 and the window 40 may be reduced on the lower edge of the second substrate 12. The gap between the second substrate 12 and the window 40 would, for example, increase deformation of the display panel 10 if an electronic device such as a smartphone including a display device falls, and may increase a damage rate of the display device. The gap may be reduced by the extension 22 of the polarizing layer 20 by a thickness of the extension 22, so that the damage to the display device may be reduced.

A groove (G) is formed in the border portion of the main portion 21 and the extension 22 on the polarizing layer 20. The groove (G) extends along the border (B) of the main portion 21 and the extension 22. The polarizing layer 20 may be divided into the main portion 21 and the extension 22 by the groove (G). The groove (G) functions to prevent the end portion of the adhesive agent from falling when the adhesive agent is coated.

The window 40 is disposed on the polarizing layer 20, and the adhesive layer 30 for combining the polarizing layer 20 and the window 40 is disposed between the same. The window 40 protects the display panel 10 and the polarizing layer 20 from being damaged by external impacts. The window 40 may be formed with a transparent and hard material such as glass or plastic. The adhesive layer 30 is provided to cover the main portion 21 of the polarizing layer 20, and it may not be disposed on the extension 22.

At least one functional sheet 50 for buffering, protection against heat, shielding light, and insulating may be disposed below the first substrate 11.

The overall configuration of the display device has been described. A polarizing layer 20, a groove (G) formed in the polarizing layer 20, and an adhesive layer 30 will now be described.

Figure 3:
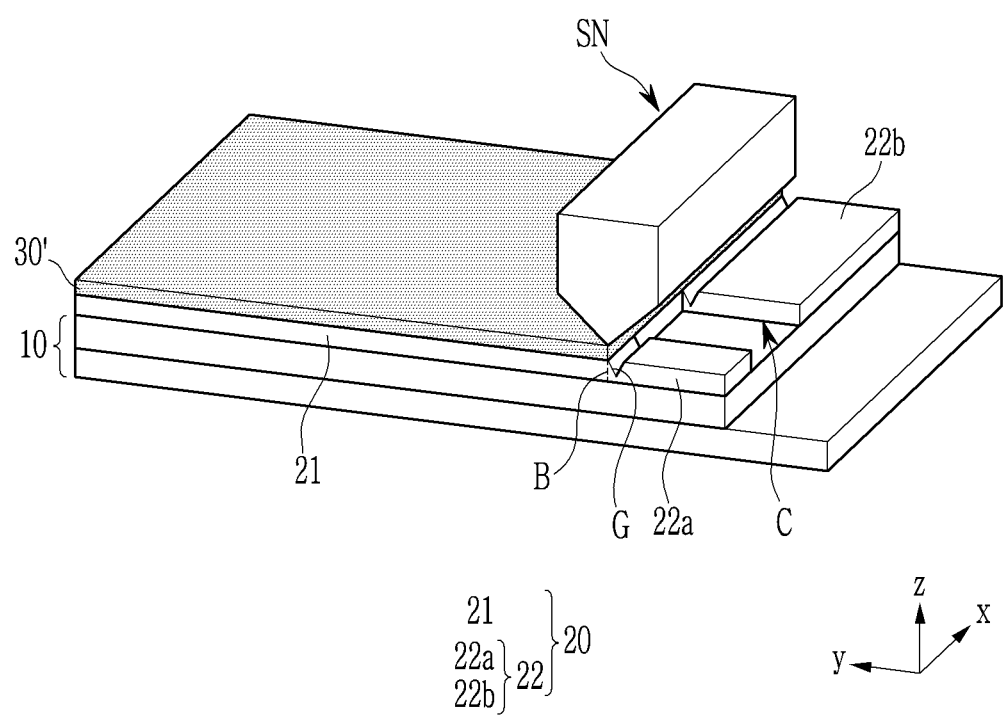
FIG. 3 shows coating of an adhesive agent on a polarizing layer.
Figure 4:
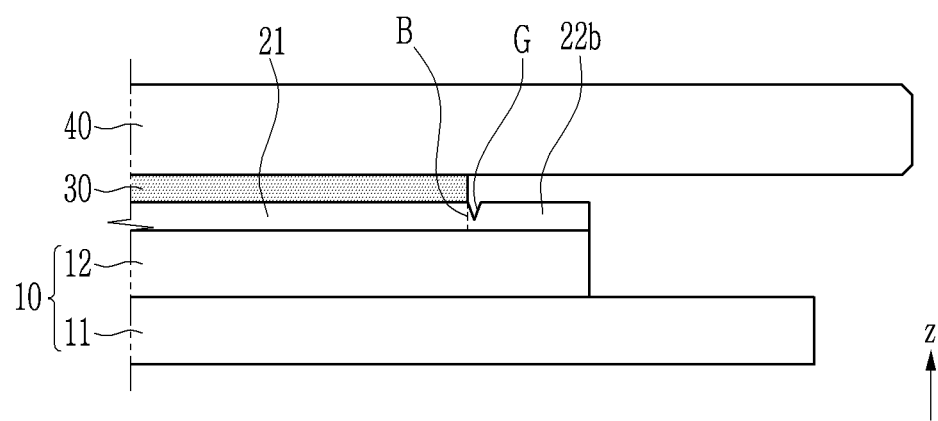
FIG. 4 shows a cross-sectional view with respect to a line IV-IV' of FIG. 1.
Figure 5:
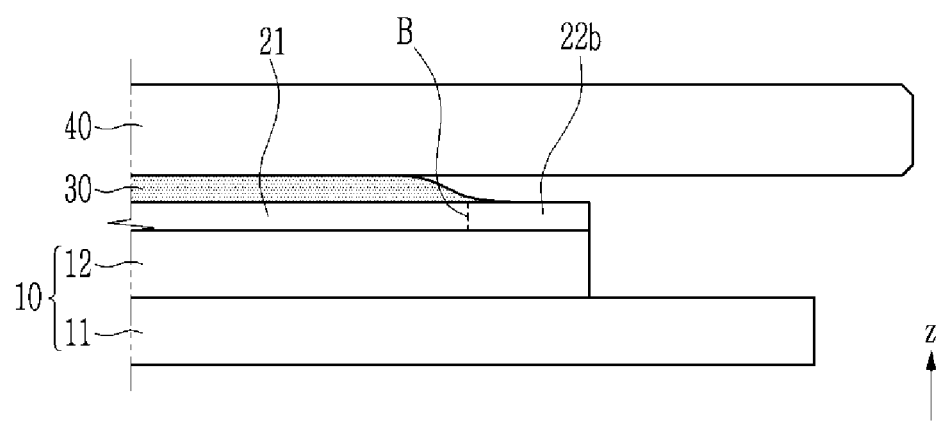
FIG. 5 shows a cross-sectional view of a region corresponding to FIG. 4 in a display device in which a groove is not formed in a polarizing layer.

FIG. 3 shows coating of an adhesive agent 30' on a polarizing layer 20, FIG. 4 shows a cross-sectional view with respect to a line IV-IV' of FIG. 1, and FIG. 5 shows a cross-sectional view of a region corresponding to FIG. 4 in a display device in which a groove (G) is not formed in a polarizing layer 20.

Referring to FIG. 3, the adhesive layer 30 may be formed by slit lamination. For example, an adhesive agent 30' such as a liquefied optically clear resin (OCR) may be coated on the polarizing layer 20 by using a coating device including a slit nozzle (SN). In this instance, the adhesive agent 30' comes through the slit nozzle (SN) and is coated on the main portion 21 of the polarizing layer 20 at a predetermined thickness until it reaches the border (B) of the main portion 21 and the extension 22. UV rays are irradiated to the coated adhesive agent 30' to lightly cure the same, the window 40 is arranged and bonded, and the UV rays are irradiated to the same to mainly cure the same and finally form the adhesive layer 30.

When the liquefied adhesive agent 30' is coated to the edge of the polarizing layer 20, the predetermined thickness may be maintained substantial to the end portion of the coated adhesive agent by surface tension. However, when the polarizing layer 20 is not coated to the edge, the end portion of the coated adhesive agent 30' may not sustain the shape but may be broken or spread. Referring to FIG. 4, the groove (G) formed along the border (B) of the main portion 21 and the extension 22 may produce an effect as if coating the adhesive agent 30' to the edge of the polarizing layer 20 when coating up to the same to the border (B) of the main portion 21 of the polarizing layer 20 and the extension 22. On the contrary, referring to FIG. 5, a result when the groove (G) is not formed between the main portion 21 and the extension 22 is shown. That is, when the adhesive agent 30' is coated up to the border of the main portion 21 and the extension 22, the surface tension for maintaining the shape of the adhesive agent 30' is not generated, so the end portion of the adhesive agent 30' is spread, and the adhesive layer 30 is formed to be spread. By this, an attaching force of the polarizing layer 20 and the window 40 may become weak, or the spread end portion may be seen as stains. This may deteriorate reliability and quality of the display device.

A configuration of the polarizing layer 20 and the groove (G) will now be described.

Figure 6:
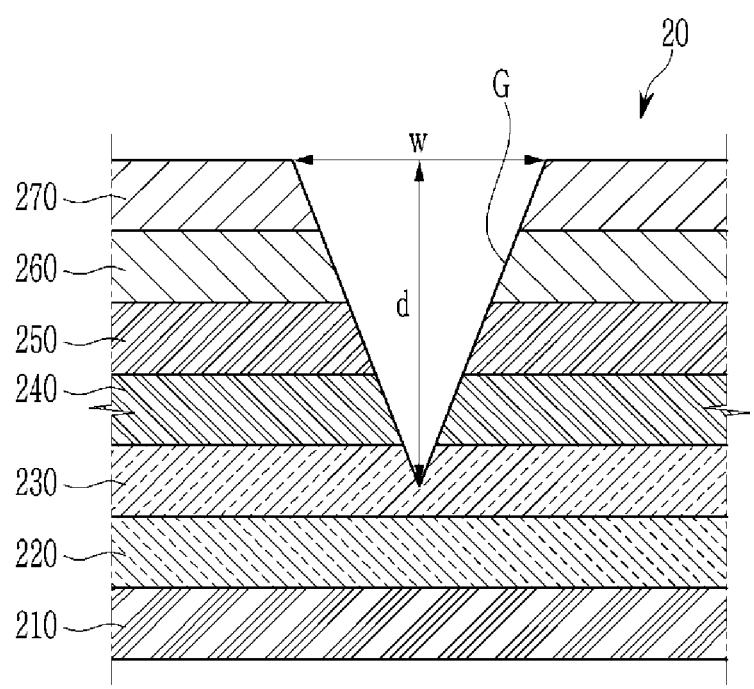
FIG. 6, FIG. 7, and FIG. 8 show cross-sectional views of a polarizing layer in which a groove is formed according to an exemplary embodiment.
Figure 7:
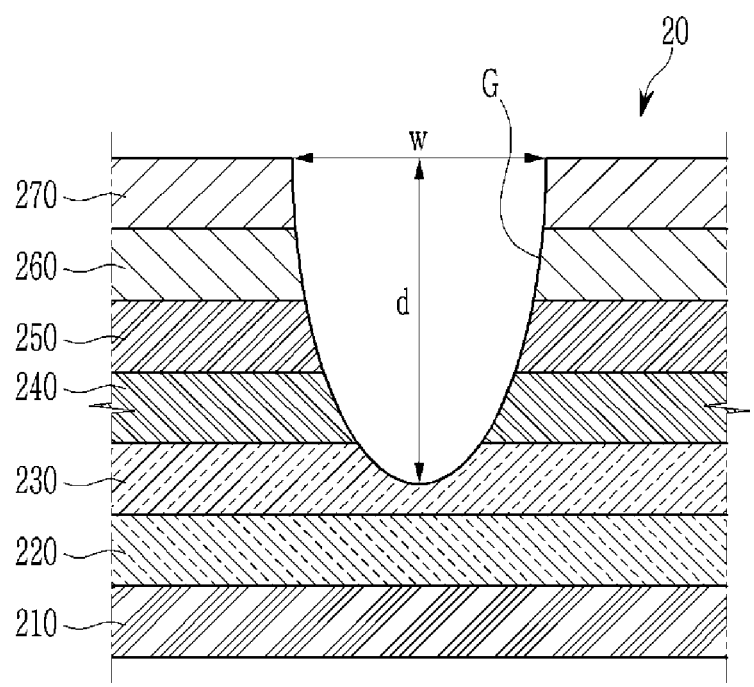
Figure 8:
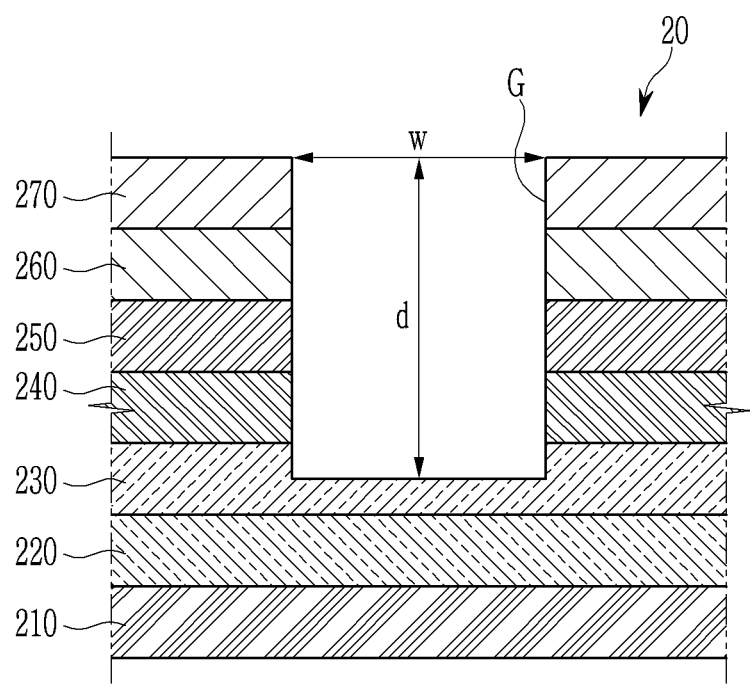

FIG. 6, FIG. 7, and FIG. 8 show cross-sectional views of a polarizing layer 20 in which a groove (G) is formed according to an exemplary embodiment. In the respective drawings, the left portion and the right portion of the groove (G) may be the main portion 21 and the extension 22 of the polarizing layer 20.

Referring to FIG. 6, FIG. 7, and FIG. 8, the polarizing layer 20 may include an adhesive layer 210, a phase retarder layer 220, an adhesive layer 230, a second support layer 240, a polarizer layer 250, a first support layer 260, and a passivation layer 270. The polarizing layer 20 may include, as a default, a phase retarder layer 220, a polarizer layer 250, and a first support layer 260, and it may include, as options, at least one of an adhesive layer 210, an adhesive layer 230, a second support layer 240, and a passivation layer 270. The polarizer layer 250 may be a linear polarizer layer, and it may be an iodine-doped poly-vinyl alcohol (PVA) layer. The first support layer 260 and the second support layer 240 may be tri-acetyl cellulose (TAC) layers. A surface of the first support layer 260 may be coated to show characteristics such as hardness, scattering, low reflection, or antiglare. The polarizing layer 20 may be provided as a single complex film, so it may be attached to the second substrate 12 of the display panel 10 by the adhesive layer 210. The phase retarder layer 220 may be coated on the second substrate 12.

The groove (G) may be formed with a predetermined width (w) and depth (d). Particularly, regarding the depth (d), the groove (G) may pass through the passivation layer 270 and the first support layer 260 and may be formed to at least reach the polarizer layer 250. The groove (G) may or may not pass through the polarizer layer 250. When the polarizing layer 20 includes a second support layer 240, the groove (G) may be formed to at least reach the second support layer 240. The groove (G) may be formed to reach the phase retarder layer 220 or the adhesive layer 210, and in this case, the main portion 21 may be separated from the extension 22, so it may be difficult to attach the polarizing layer 20. Therefore, it may be advantageous for the groove (G) to not be formed up to the phase retarder layer 220 in the process.

The depth (d) may be about 30 to 150 micrometers, and the width (w) may be about 50 to 200 micrometers. It will be more advantageous as the depth (d) and the width (w) of the groove (G) become bigger. For example, this may be because when the width (w) is very narrow, the coated adhesive agent may go across the groove (G) and may be spread. However, the depth (d) and the width (w) of the groove (G) may be changeable in various ways depending on the characteristic (e.g., viscosity) of the adhesive agent coated therein and the surface characteristics of the polarizing layer 20.

The groove (G) may have a V-shaped cross-sectional form as shown in FIG. 6, a U-shaped cross-sectional form as shown in FIG. 7, and a substantially rectangular-shaped cross-sectional form as shown in FIG. 8, but it is not limited thereto, and it may have various cross-sectional forms. The groove (G) may be mechanically formed by a knife, or it may be formed by irradiating laser beams.

Figure 9:
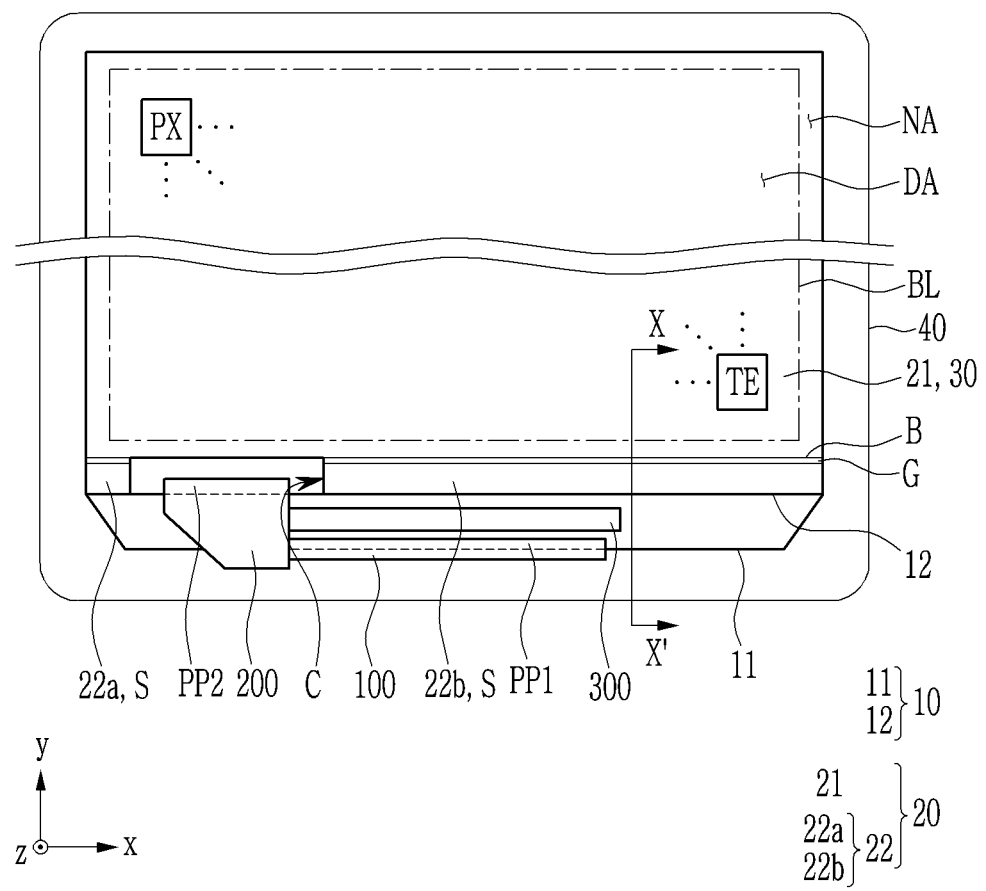
FIG. 9 shows a top plan view of a display device according to an exemplary embodiment.
Figure 10:
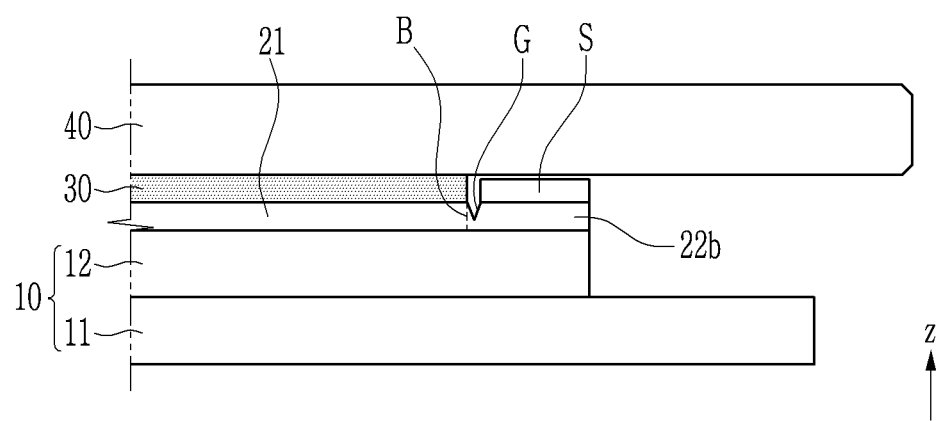
FIG. 10 shows a cross-sectional view with respect to a line X-X' of FIG. 9.

FIG. 9 and FIG. 10 show an exemplary embodiment for further reducing the gap between the display panel 10 and the window 40. FIG. 9 shows a top plan view of a display device according to an exemplary embodiment, and FIG. 10 shows a cross-sectional view with respect to a line X-X' of FIG. 9.

Referring to FIG. 9 and FIG. 10, a spacer (S) is disposed on the extension 22 of the polarizing layer 20, which is different from the previously-described exemplary embodiments. The spacer (S) fills the gap between the polarizing layer 20 and the window 40 on the lower edge of the second substrate 12. Therefore, when the electronic device including a display device is impacted such as by falling, transformation of the display panel 10 may be minimized and the display device may be prevented from being damaged. The spacer (S) may be formed before the adhesive agent 30' in FIG. 3 is coated, or the spacer (S) may be formed after the adhesive agent 30' is coated. When the spacer (S) is formed before the adhesive agent 30' is coated, the spacer (S) may prevent the adhesive agent 30' from being formed after going over the cutout (C).

The spacer (S) may be provided in various ways. For example, regarding the polarizing layer 20 shown in FIG. 6 to FIG. 8, the passivation layer 270 of the main portion 21 may be removed and the passivation layer 270 of the extension 22 may be maintained. An adhesive layer 30 with a predetermined thickness is disposed on the main portion 21, and the passivation layer 270 of the extension 22 may function as a spacer (S) for reducing the gap caused by the adhesive layer 30 on the main portion 21. Differing from this, the spacer (S) may be formed by attaching a cushion tape or a plastic film.

A cross-sectional structure of a display device according to an exemplary embodiment will now be described with reference to FIG. 11.

Figure 11:
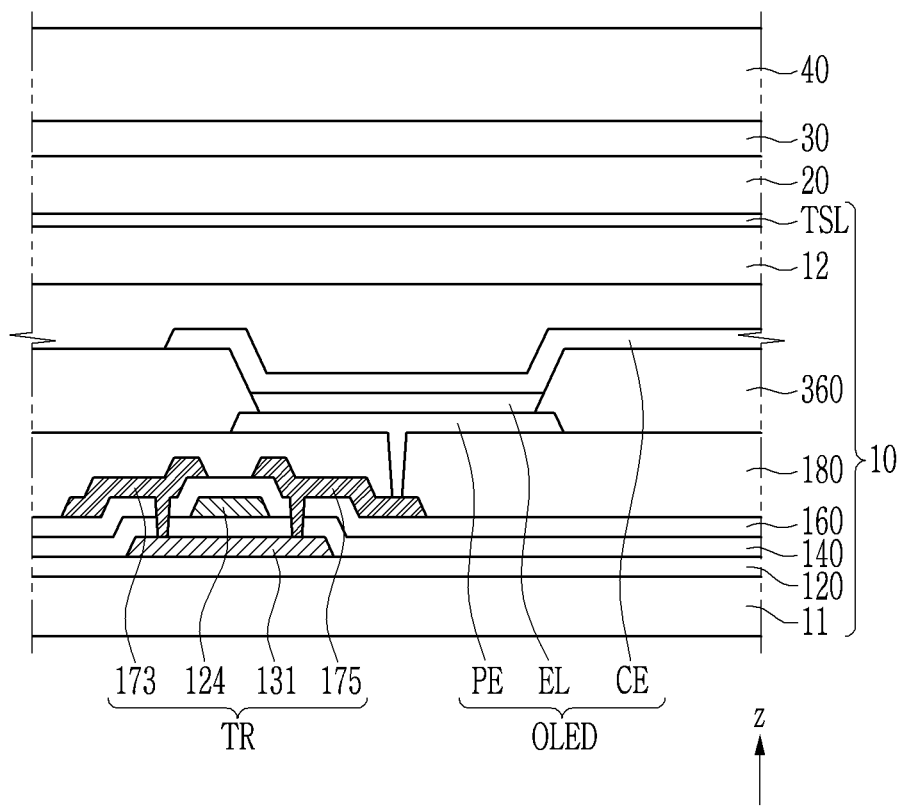
FIG. 11 shows a cross-sectional view of a display device according to an exemplary embodiment.

FIG. 11 shows a cross-sectional view of an example of a stacked configuration of a display panel 10 in a display device according to an exemplary embodiment. The cross-section shown in FIG. 11 may correspond to one pixel area. The display device includes a display panel 10, and a polarizing layer 20, an adhesive layer 30, and a window 40 stacked thereon. The display panel 10 includes a first substrate 11, a transistor (TR) formed on the first substrate 11, an organic light emitting diode (OLED) connected thereto, and a second substrate 12 that is an encapsulation substrate.

The first substrate 11 may be a hard substrate made of glass. The first substrate 11 may be a flexible substrate made of a polymer such as a polyimide, a polyamide, or polyethylene terephthalate.

A buffer layer 120 is disposed on the first substrate 11. The buffer layer 120 may block an impurity that can be spread to a semiconductor layer 131 from the substrate 11, and may reduce a stress provided to the substrate 11 during the process for forming the semiconductor layer 131.

The semiconductor layer 131 of the transistor (TR) is disposed on the buffer layer 120, and a gate insulating layer 140 is disposed on the semiconductor layer 131. The semiconductor layer 131 includes a source region and a drain region, and a channel region between them. The semiconductor layer 131 may include polysilicon, an oxide semiconductor, or amorphous silicon. The gate insulating layer 140 may include an inorganic insulating material such as a silicon oxide or a silicon nitride.

A gate conductor including a gate electrode 124 of the transistor (TR) is disposed on the gate insulating layer 140. The gate conductor may include, for example, a metal such as molybdenum (Mo), copper (Cu), aluminum (Al), silver (Ag), chromium (Cr), tantalum (Ta), or titanium (Ti), or a metal alloy thereof.

An inter-layer insulating layer 160 is disposed on the gate conductor. The inter-layer insulating layer 160 may include an inorganic insulating material.

A data conductor including a source electrode 173 and a drain electrode 175 of the transistor (TR) is disposed on the inter-layer insulating layer 160. The source electrode 173 and the drain electrode 175 are connected to the source region and the drain electrode of the semiconductor layer 131 through contact holes formed in the inter-layer insulating layer 160 and the gate insulating layer 140. The data conductor may include, for example, a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni), or a metal alloy thereof.

A passivation layer 180 is disposed on the data conductor. The passivation layer 180 may include an organic insulating material. A pixel electrode (PE) is disposed on the passivation layer 180. The pixel electrode (PE) may be connected to the drain electrode 175 through a contact hole formed in the passivation layer 180 to receive a data signal for controlling luminance of the organic light emitting diode (OLED). The pixel electrode (PE) may include a metal such as silver (Ag), nickel (Ni), gold (Au), platinum (Pt), aluminum (Al), copper (Cu), or molybdenum/aluminum neodymium (Mo/AlNd), or a metal alloy thereof.

A pixel defining layer 360 is disposed on the passivation layer 180. The pixel defining layer 360 includes an opening overlapping the pixel electrode (PE). Regarding the opening of the pixel defining layer 360, an emission layer (EL) is disposed on the pixel electrode (PE), and a common electrode (CE) is disposed on the emission layer (EL). The pixel electrode (PE), the emission layer (EL), and the common electrode (CE) configure an organic light emitting diode (OLED). The pixel electrode (PE) may be an anode of the organic light emitting diode (OLED), and the common electrode (CE) may be a cathode of the organic light emitting diode (OLED). The common electrode (CE) may include a transparent conductive material such as an indium tin oxide (ITO) or an indium zinc oxide (IZO).

A second substrate 12 for protecting the organic light emitting diode (OLED) is disposed on the common electrode (CE). A thin film encapsulation layer may be provided, instead of the second substrate 12, by stacking an inorganic material layer and/or an organic material layer.

A touch sensor layer (TSL) is disposed on the second substrate 12. The touch sensor layer (TSL) may include touch electrodes formed of a transparent conductive material such as an ITO or an IZO, and a metal mesh, and the touch electrodes may be formed to be a single layer or multiple layers.

A polarizing layer 20 for reducing reflection of external light is disposed on the touch sensor layer (TSL), and an adhesive layer 30 for attaching the window 40 is disposed on the polarizing layer 20. A passivation film for protecting the display panel 10 and/or a functional sheet may be disposed below the first substrate 11.

The case in which the display device is an organic light emitting device has been exemplified, and the display device may exemplarily be a liquid crystal display including a liquid crystal layer.

While the present inventive concept has been described in connection with what is presently considered to be practical exemplary embodiments, it is to be understood that the present inventive concept is not limited to the disclosed embodiments, but, on the contrary, is intended to cover various modifications and equivalent arrangements included within the spirit and scope of the appended claims.

What is claimed is:

1. A display device comprising:
a display panel including a display area and a non-display area, the display panel having a first substrate and a second substrate disposed on the first substrate;
a polarizing layer disposed on the display panel and including a main portion at least covering the display area and an extension covering a part of the non-display area;
a first flexible printed circuit film bonded to the first substrate; and
a second flexible printed circuit film bonded to the second substrate,
wherein the polarizing layer includes a groove formed on a surface of the polarizing layer and extending along a border of the main portion and the extension, and
wherein the extension of the polarizing layer is disposed at each side of the second flexible printed circuit film.

2. The display device of claim 1, further comprising:
an adhesive layer disposed on the polarizing layer; and
a window disposed on the adhesive layer,
wherein the adhesive layer overlaps the main portion of the polarizing layer and does not overlap the extension of the polarizing layer.

3. The display device of claim 2, wherein
the polarizing layer is disposed on the second substrate, the first substrate includes an edge area not overlapping the second substrate, and
the extension of the polarizing layer is positioned near the edge area of the first substrate.

4. The display device of claim 3, wherein
the polarizing layer includes a cutout, and
the extension of the polarizing layer is disposed at respective sides of the cutout.

5. The display device of claim 2, further comprising
A spacer disposed between the extension of the polarizing layer and the window.

6. The display device of claim 1, wherein
the polarizing layer includes a phase retarder layer, a polarizer layer disposed on the phase retarder layer, and a first support layer disposed on the polarizer layer, and
the groove passes through the first support layer and at least reaches the polarizer layer.

7. The display device of claim 6, wherein
the polarizing layer further includes a passivation layer disposed on the first support layer, and
the groove is formed at least to the polarizer layer from the passivation layer.

8. The display device of claim 6, wherein
the polarizing layer further includes a second support layer disposed between the phase retarder layer and the polarizer layer, and
the groove is formed at least to the second support layer.

9. The display device of claim 1, wherein
the groove has a V shape, a U shape, or a quadrangular cross-sectional shape.

10. A display device comprising:
a display panel including a first substrate and a second substrate disposed on the first substrate;
a polarizing layer disposed on the second substrate;
a first flexible printed circuit film bonded to the first substrate; and
a second flexible printed circuit film bonded to the second substrate,
wherein the first substrate includes a first pad portion bonded to the first flexible printed circuit film and the second substrate includes a second pad portion bonded to the second flexible printed circuit film,
the polarizing layer includes a main portion and an extension comprising a first portion, a second portion, a cutout formed between the first portion and the second portion of the extension, and
wherein the extension of the polarizing layer is disposed at each side of the second flexible printed circuit film.

11. The display device of claim 10, wherein
the display panel includes a display area and a non-display area,
the main portion of the polarizing layer covers at least the display area and the extension of the polarizing layer covers the non-display area, and
the cutout of the polarizing layer is defined by edges facing the extension and an edge of the main portion adjacent to the edges.

12. The display device of claim 11, wherein
an edge of the extension corresponds to an edge of the second substrate adjacent to the pad portion.

13. The display device of claim 12, further comprising
a spacer disposed between the extension of the polarizing layer and the window.

14. The display device of claim 11, wherein
the polarizing layer includes a groove extending along a border of the main portion and the extension.

15. The display device of claim 11, further comprising:
an adhesive layer disposed on the polarizing layer; and
a window disposed on the adhesive layer, wherein the adhesive layer overlaps the main portion of the polarizing layer and does not overlap the extension of the polarizing layer.

16. The display device of claim 11, wherein the extension of the polarizing layer is disposed at each sides of the pad portion.

17. The display device of claim 11, wherein
the polarizing layer includes a phase retarder layer, a polarizer layer disposed on the phase retarder layer, and a first support layer disposed on the polarizer layer, and
the groove passes through the first support layer and at least reaches the polarizer layer.

18. The display device of claim 17, wherein
the polarizing layer further includes a passivation layer disposed on the first support layer, and
the groove is formed at least to the polarizer layer from the passivation layer.

19. The display device of claim 17, wherein
the polarizing layer further includes a second support layer disposed between the phase retarder layer and the polarizer layer, and
the groove is formed at least to the second support layer.

* * * * *